United States Patent
Puckett et al.

(10) Patent No.: US 9,537,485 B2
(45) Date of Patent: Jan. 3, 2017

(54) ADAPTIVE DYNAMIC KEEPER CIRCUIT

(71) Applicant: QUALCOMM Incorporated, San Diego, CA (US)

(72) Inventors: Joshua Lance Puckett, Cary, NC (US); Anthony Dale Klein, Raleigh, NC (US); Kaushik Viswanathan, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/630,156

(22) Filed: Feb. 24, 2015

(65) Prior Publication Data

US 2016/0099713 A1   Apr. 7, 2016

Related U.S. Application Data

(60) Provisional application No. 62/060,929, filed on Oct. 7, 2014.

(51) Int. Cl.
  *H03K 19/096*  (2006.01)
  *H03K 19/003*  (2006.01)
  *H03K 19/0948*  (2006.01)

(52) U.S. Cl.
  CPC .. *H03K 19/00315* (2013.01); *H03K 19/00361* (2013.01); *H03K 19/0963* (2013.01); *H03K 19/09482* (2013.01)

(58) Field of Classification Search
  CPC ............................ H03K 19/0963; H03K 19/096
  USPC .......................................... 326/95, 97, 98, 93
  See application file for complete search history.

(56) References Cited

U.S. PATENT DOCUMENTS

| | | | |
|---|---|---|---|
| 6,940,314 B1 | 9/2005 | Bloker | |
| 7,256,621 B2 | 8/2007 | Lih et al. | |
| 7,417,469 B2 | 8/2008 | Cheng et al. | |
| 8,125,842 B2 | 2/2012 | Dudeck et al. | |
| 8,362,806 B2 * | 1/2013 | Wijeratne | H03K 19/0963 326/95 |
| 2004/0104744 A1 | 6/2004 | Bosshart | |
| 2005/0083082 A1 | 4/2005 | Olofsson | |
| 2006/0103430 A1 * | 5/2006 | Yuan | H03K 19/0963 326/97 |
| 2014/0071776 A1 | 3/2014 | Chong et al. | |
| 2014/0226418 A1 | 8/2014 | Ganesan et al. | |

OTHER PUBLICATIONS

International Search Report and Written Opinion—PCT/US2015/048247—ISA/EPO—Nov. 20, 2015.

* cited by examiner

*Primary Examiner* — Daniel D Chang
(74) *Attorney, Agent, or Firm* — Patterson & Sheridan, L.L.P.

(57) ABSTRACT

Aspects disclosed herein describe a keeper circuit that adapts to variations in the fabrication process used to manufacture a dynamic circuit. The different characteristics of the circuit elements may cause a keeper circuit to behave in an unintended manner. In one example, a logical state of the dynamic circuit may be erroneously changed because of a strong (i.e., leaky) NMOS transistor in a pull down or discharge path. An adaptive keeper circuit, however, is designed to prevent such unintended behavior regardless of any change in the characteristics of the circuit elements in the dynamic circuit. The adaptive keeper circuit matches the behavior of the pull down path and prevents the pull down path from erroneously changing the logical state stored by the dynamic circuit.

26 Claims, 7 Drawing Sheets

ADAPTIVE DYNAMIC KEEPER CIRCUIT

This application claims benefit of U.S. provisional patent application Ser. No. 62/060,929, filed Oct. 7, 2014. The aforementioned related patent application is herein incorporated by reference in its entirety.

FIELD

Aspects disclosed herein relate to keeper circuits and more specifically to keeper circuits that adapt to variations in a fabrication process.

BACKGROUND

Advances in technology have resulted in smaller and more powerful personal computing devices. For example, there currently exist a variety of portable personal computing devices, including wireless computing devices, such as mobile phones, smart phones, netbooks and laptops that are small, lightweight, and easily carried by users. More specifically, such devices may communicate voice and data packets over wireless networks. Many such devices incorporate additional features to provide enhanced functionality for end users. For example, a smart phone can also include a digital still camera, a digital video camera, a digital recorder, and an audio file player. Each of these portable personal computing devices may include a variety of different integrated circuits for performing the various functions.

The integrated circuits may include dynamic circuits which use a clock to perform a pre-charge phase and an evaluate phase. During the pre-charge phase (or setup phase), the dynamic circuit resets a logical state node to a predetermined logical state (conventionally, a logical one). During the evaluation phase, the logical state stored in the dynamic circuit is evaluated. In one example, the pre-charge phase is performed when the clock is low and the evaluation phase is performed when the clock is high.

The performance and functionality of the dynamic circuit may be affected by variations in the fabrication process used to manufacture the dynamic circuit. For example, variations in the fabrication process may change the leakage current or strength of NMOS and PMOS transistors in the dynamic circuit, which alters its performance. In some cases, the variations in the fabrication process can cause the dynamic circuit to erroneously change its logical state.

SUMMARY

Aspects disclosed herein include a dynamic circuit with a logical state node and keeper circuit coupled to the logical state node. The keeper circuit includes a first circuit element configured to output a control signal that affects an activation delay associated with the keeper circuit. The dynamic circuit also includes a pull down circuit coupled to the logical state node, where the pull down circuit includes a second circuit element. During at least a portion of an evaluation phase of the dynamic circuit, the first circuit element is configured to electrically float the control signal in parallel with the second circuit element changing a voltage on the logical state node.

In another aspect, a dynamic circuit includes means for selectively keeping a voltage of a logical state node of the dynamic circuit. The dynamic circuit further includes means for selectively pulling down the voltage of the logical state node during an evaluation phase. The dynamic circuit further includes means for preventing a loss of a logical state of the logical state node during at least a portion of the evaluation phase by electrically floating a control signal that affects an activation delay associated with the means for selectively keeping in parallel with the means for selectively pulling down changing the voltage of the logical state node.

In another aspect, a method of operating a dynamic circuit includes changing a voltage of a logical state node in response to a first leakage current flowing through a first NMOS transistor. The method further includes changing a voltage of a control signal associated with a keeper circuit in response to a second leakage current flowing through a second NMOS transistor. The method further includes at least partially activating a PMOS transistor, based on the changed voltage of the control signal, to counteract the change in voltage of the logical state node.

In yet another aspect, a dynamic circuit includes a delay circuit in a global adaptive keeper circuit configured to receive a pre-charge signal and output a delayed version of the pre-charge signal. The dynamic circuit further includes a feed-forward path in the global adaptive keeper circuit configured to receive the pre-charge signal and output an undelayed version of the pre-charge signal. The dynamic circuit further includes a pre-stage circuit comprising a first circuit element, and the pre-stage circuit is coupled to the output of the delay circuit and the output of the feed-forward path. The pre-stage circuit is configured to output a global control signal. The dynamic circuit further includes a plurality of logical state nodes and a plurality of local keeper circuits, each associated with one of the plurality of logical state nodes. Each of the plurality of local keeper circuits is configured to receive one of a plurality of local control signals. Each of the plurality of local control signals is configured to be generated based on the global control signal, and is further configured to affect an activation delay associated with one of the plurality of local keeper circuits. The dynamic circuit further includes a plurality of pull-down circuits, each comprising a second circuit element. Each of the plurality of pull-down circuits is associated with one of the plurality of logical state nodes and one of the plurality of local keeper circuits. During at least a portion of an evaluation phase of the dynamic circuit, the first circuit element is configured to electrically float each local control signal in parallel with each second circuit element changing a voltage on each associated logical state node of the plurality of logical state nodes.

In yet another aspect, a design structure embodied in a non-transitory computer readable medium for at least one of designing, manufacturing, and testing a design includes a logical state node and a keeper circuit coupled to the logical state node. The keeper circuit includes a first circuit element configured to output a control signal that affects an activation delay associated with the keeper circuit. The design structure also includes a pull down circuit coupled to the logical state node where the pull down circuit includes a second circuit element. Moreover, the first circuit element is configured to electrically float the control signal in parallel with the second circuit element changing a voltage on the logical state node during at least a portion of an evaluation phase of a dynamic circuit.

In yet another aspect, a design structure embodied in a non-transitory computer readable medium for at least one of designing, manufacturing, and testing a design includes a delay circuit in a global adaptive keeper circuit configured to receive a pre-charge signal and output a delayed version of the pre-charge signal. The design structure also includes a feed-forward path in the global adaptive keeper circuit configured to receive the pre-charge signal and output an undelayed version of the pre-charge signal and a pre-stage circuit comprising a first circuit element where the pre-stage circuit being coupled to the output of the delay circuit and the output of the feed-forward path and is configured to output a global control signal. The design structure includes a plurality of logical state nodes and a plurality of local keeper circuits, each associated with one of the plurality of logical state nodes and where each of the plurality of local keeper circuits configured to receive one of a plurality of local control signals. Further, each of the plurality of local control signals is configured to be generated based on the global control signal and is configured to affect an activation delay associated with one of the plurality of local keeper circuits. The design structure includes a plurality of pull down circuits, each associated with one of the plurality of logical state nodes and one of the plurality of local keeper circuits, where each of the plurality of pull down circuits includes a second circuit element. During at least a portion of an evaluation phase of a dynamic circuit, the first circuit element is configured to electrically float each local control signal in parallel with each second circuit element changing a voltage on each associated logical state node of the plurality of logical state nodes

BRIEF DESCRIPTION OF THE DRAWINGS

So that the manner in which the above recited aspects are attained can be understood in detail, a more particular description of aspects of the disclosure, briefly summarized above, may be had by reference to the appended drawings.

It is to be noted, however, that the appended drawings illustrate only aspects of this disclosure and are therefore not to be considered limiting of its scope, for the disclosure may admit to other aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Aspects disclosed herein describe a keeper circuit (also referred to herein as an "adaptive keeper circuit") that adapts to variations in the fabrication process used to manufacture a dynamic circuit. For example, numerous instances of the dynamic circuit may be fabricated on a single large wafer. However, due to process variations, different instances of the dynamic circuit may have different characteristics. For example, a first dynamic circuit may have NMOS transistors that are leakier than the NMOS transistors in a second dynamic circuit.

The different characteristics of the circuit elements may cause the dynamic circuit to behave in an unintended manner. In one example, a logical state stored by the dynamic circuit may be erroneously changed because of a strong (i.e., leaky) NMOS transistor in a pull down or discharge path. An adaptive keeper circuit, however, is designed to prevent such unintended behavior resulting from variations in the characteristics of the circuit elements in the dynamic circuit. To do so, the adaptive keeper circuit may include one or more circuit elements that have characteristics that are similar to the characteristics of the circuit elements in the pull down path. For example, the adaptive keeper circuit includes at least one NMOS transistor that has one or more characteristics similar to the characteristics of at least one NMOS transistor in the pull down path (e.g., the leakage currents of the transistors are substantially the same). Using a feed-forward path that bypasses a delay circuit, the adaptive keeper circuit uses the NMOS transistor to turn on a PMOS transistor in the adaptive keeper circuit earlier, which counteracts the strong NMOS transistor in the pull down path. As will be described in greater detail below, the adaptive keeper circuit counteracts the behavior of the pull down path and is designed to prevent the pull down path from erroneously changing the logical state stored by the dynamic circuit.

Furthermore, the adaptive keeper circuit may be designed to provide additional time for the pull down path to discharge the logical state stored by the dynamic circuit during an evaluation phase. For example, when the NMOS transistors in the pull down path are weak (i.e., require additional time to discharge the stored logical state), the adaptive keeper circuit mitigates the amount of leakage current from its PMOS transistors (which are connected to VDD) by keeping these transistors off for a longer period. Doing so means the weak NMOS transistors in the pull down path have to counteract less leakage current from VDD when discharging the logical state to VSS. The following description provides various embodiments of dynamic circuits with adaptive keeper circuits for preventing variations in the fabrication process from erroneously changing the logical state stored by the dynamic circuit.

Figure 1:
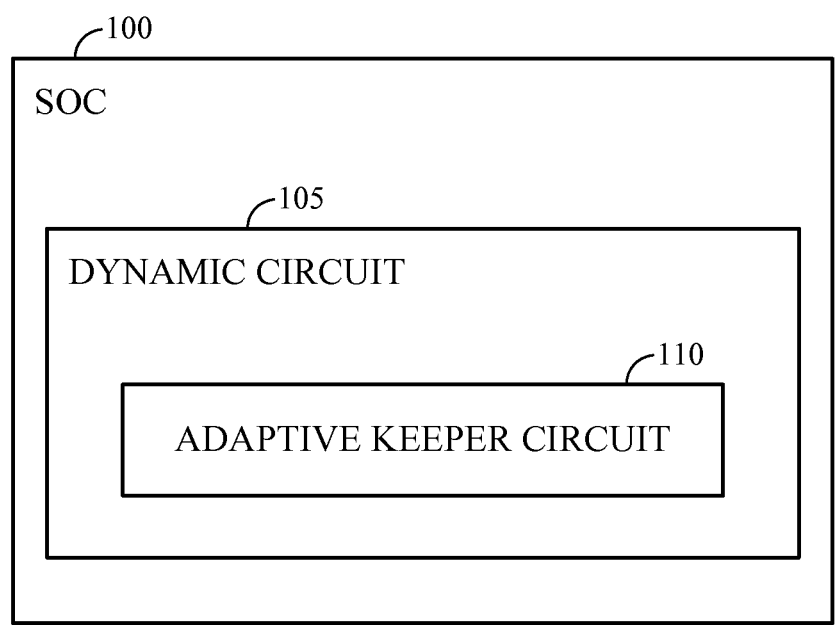
FIG. 1 is a functional block diagram of a system on a chip, according to one aspect.

FIG. 1 is a functional block diagram of a system-on-chip (SOC) 100, according to one aspect. The SOC 100 is an integrated circuit (IC) that integrates components of a computer or other electronic system into a single chip. The SOC 100 may include digital, analog, mixed-signal, and radio-frequency functions all on a single chip substrate. Moreover, the SOC 100 and its functionalities may be designed and configured into computer files (e.g. RTL, GDSII, GERBER, etc.) that include design data stored on computer readable storage media. Some or all such files may be provided to fabrication handlers who configure fabrication equipment using the design data to fabricate the devices described herein. Resulting products formed from the computer files include semiconductor wafers that are then cut into semiconductor die (e.g., SOC 100) and packaged, and may be further integrated into products including, but not limited to, mobile phones, smart phones, laptops, netbooks, ultrabooks, desktop computers, digital video recorders, set-top boxes and any other devices where integrated circuits are used.

In one embodiment, the computer files form a design structure including the circuits described below and shown in FIGS. 1-3 and 5 in the form of physical design layouts, schematics, a hardware-description language (e.g., Verilog, VHDL, etc.). For example, design structure may be a text file or a graphical representation of a circuit as described below and shown in FIGS. 1-3 and 5. Design process preferably synthesizes (or translates) the circuits described below into a netlist, where the netlist is, for example, a list of wires, transistors, logic gates, control circuits, I/O, models, etc. that describes the connections to other elements and circuits in an integrated circuit design and recorded on at least one of machine readable medium. For example, the medium may be a storage medium such as a CD, a compact flash, other flash memory, or a hard-disk drive. In another embodiment, the hardware, circuitry, and method described herein may be configured into computer files that simulate the function of the circuits described below and shown in FIGS. 1-3, 5 and 6 when executed by a processor. These computer files may be used in circuitry simulation tools, schematic editors, or other software applications.

As shown, SOC 100 includes a dynamic circuit 105 which, as described above, uses a clock to perform a pre-charge phase and an evaluate phase. During the pre-charge phase (or setup phase), the dynamic circuit 105 is reset to a predetermined logical state—i.e., either a logical zero or one. During the evaluation phase, the logical state stored in the dynamic circuit 105 is evaluated. The dynamic circuit 105 may be used in a wide range of logic circuits and devices such as CMOS logic circuitry, Domino logic circuitry, and memory elements (e.g., buffers, registers, etc.).

Dynamic circuit 105 includes an adaptive keeper circuit 110 which prevents abnormal behavior in the dynamic circuit 105 due to variations in the fabrication process. Conventionally, keeper circuits may be used in dynamic circuits to prevent abnormal behavior when the dynamic circuit is subjected to a high leakage condition. For example, the adaptive keeper circuit 110 holds (or keeps) a logical state when the dynamic circuit 105 is not evaluating the logical state (and thus, prevents leakage current from changing the logical state) but permits the logical state to change when the dynamic circuit 105 is evaluating the logical state or pre-charging. In addition to performing this function, the adaptive keeper circuit 110 also prevents abnormal behavior of the dynamic circuit 105 due to variations in the fabrication process, which resulted in changed characteristics of the circuit elements in the dynamic circuit 105. For example, the dynamic circuit 105 may have strong NMOS transistors if the SOC 100 is formed on one part of a wafer, but weak NMOS transistors if the SOC 100 is formed on a different part of the wafer. Because process variations are difficult to predict or control, the adaptive keeper circuit 110 is designed to prevent abnormal behavior across a wide range of process variations of the fabrication process.

Figure 2:
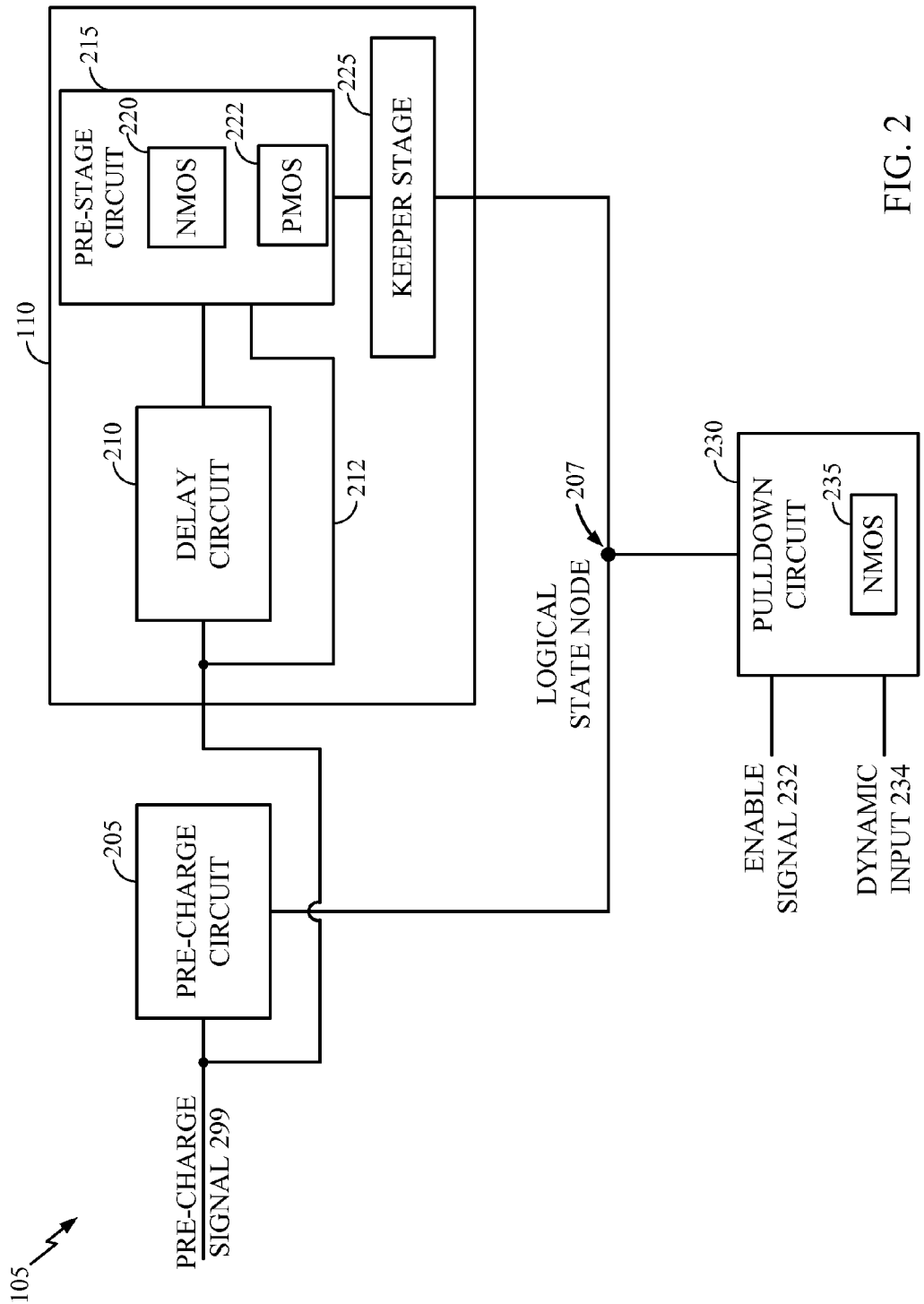
FIG. 2 is a functional block diagram of a dynamic circuit with an adaptive keeper circuit, according to one aspect.

FIG. 2 is a functional block diagram of the dynamic circuit 105 with the adaptive keeper circuit 110, according to one aspect. The dynamic circuit 105 includes a pre-charge circuit 205 which receives a pre-charge signal 299. In one aspect, the pre-charge signal 299 functions as a clock signal for the dynamic circuit 105. In one aspect, during low cycles of the pre-charge signal 299, the dynamic circuit 105 is in a pre-charge phase, but during high cycles, the dynamic circuit 105 is in an evaluation phase. The output of the pre-charge circuit 205 conditionally sets a value of a logical state node 207. For example, during a low cycle of the pre-charge signal 299, the pre-charge circuit 205 may drive the voltage of logical state node 207 to VDD, but during a high cycle, the pre-charge circuit 205 permits logical state node 207 to float with respect to the pre-charge circuit 205.

The pre-charge signal 299 is also received at a delay circuit 210 in the adaptive keeper circuit 110. The delay circuit 210 may be a series of inverters that delay the pre-charge signal 299. As will be discussed in more detail below, the delayed signal is used by the adaptive keeper circuit 110 to prevent a drive fight where the adaptive keeper circuit 110 is attempting to drive the voltage of logical state node 207 to VDD (i.e., a logical one) in parallel with a pull down circuit 230 attempting to drive the voltage of logical state node 207 to VSS (i.e., a logical zero). The delayed version of the pre-charge signal 299 is then transmitted to a pre-stage circuit 215. Furthermore, the adaptive keeper circuit 110 also includes a feed-forward path 212 that bypasses the delay circuit 210 and provides an undelayed version of the pre-charge signal 299 as a second input into pre-stage circuit 215.

Pre-stage circuit 215 is designed to prevent the pull down circuit 230 from erroneously changing the logical state of logical state node 207 during an evaluation phase. To do so, the pre-stage circuit 215 includes an NMOS transistor 220 with at least one similar characteristic as an NMOS transistor 235 used in the pull down circuit 230.

As mentioned above, variations in the fabrication processes may cause changes to the characteristics of the circuit elements in the dynamic circuit 105 relative to other dynamic circuits with identical circuit configurations. Non-limiting examples of characteristics that may change based on the fabrication process are the strength of a transistor (i.e., its ability to drive a voltage to a voltage rail such as VDD or VSS) or the leakiness of a transistor (i.e., the leakage current flowing through a transistor for a particular applied gate voltage). Generally, the change of a characteristic is constant among the same type of circuit element for a particular dynamic circuit. For example, the NMOS transistors in a first dynamic circuit may all be strong, while the NMOS transistors in a second dynamic circuit (which has the same schematic as the first dynamic circuit) are all weak. The same may be said of the characteristics of PMOS transistors where all the PMOS transistors in the same dynamic circuit have substantially the same characteristics. However, in some examples, the characteristics of different types of circuit elements are not correlated. Stated differently, the change in the characteristics of a first type of circuit element may be independent of the change in the characteristics of a second type of circuit element. For example, in a single integrated circuit or SOC, a first dynamic circuit may have strong NMOS transistors and weak PMOS transistors, a second dynamic circuit may have strong NMOS transistors and strong PMOS transistors, a third dynamic circuit may have weak NMOS transistors and weak PMOS transistors, while a fourth dynamic circuit may have weak NMOS transistors and strong PMOS transistors. Thus, although a designer can assume the circuit elements of the same type in a particular dynamic circuit have similar characteristics, the designer may be unable to assume that different types of circuit elements have similar characteristics.

Because both pre-stage circuit 215 and pull down circuit 230 include NMOS transistors (which have substantially similar characteristics despite variations in the fabrication process), the adaptive keeper circuit 110 can prevent the pull down circuit 230 from erroneously changing the logical state of logical state node 207. In one aspect, when logical state node 207 is electrically floating (i.e., is not directly connected to either VDD or VSS), the leakage current flowing through the NMOS transistor 235 in the pull down circuit 230 may nonetheless begin to discharge the voltage at logical state node 207, which may change the logical state. However, the pre-stage circuit 215 is designed such that the leakage current in NMOS transistor 220 (which may be similar to the leakage current of the NMOS transistor 235) is used to activate a PMOS transistor 222 to pull up the voltage at logical state node 207, thereby counteracting the leakage current through the pull down circuit 230.

Because the adaptive keeper circuit 110 includes at least one circuit element (i.e., NMOS transistor 220) which has similar characteristics (e.g., leakage current) as the circuit elements in the pull down circuit 230 (i.e., NMOS transistor 235), the adaptive keeper circuit 110 is able to adapt to a wide range of process variations and ensure that the changing characteristics of the different types of the circuit elements in the dynamic circuit 105 do not result in abnormal behavior. In contrast, if the adaptive keeper circuit 110 did not permit the NMOS transistor 220 to control an output current of the adaptive keeper circuit 110, the dynamic circuit 105 would not be guaranteed to hold its logical state for every process corner of the fabrication process. As described below, if the PMOS transistors in a non-adaptive keeper circuit have small leakage currents but the NMOS transistor 235 in the pull down circuit 230 has a large leakage current, then this leakage current may erroneously change logical state node 207 from a logical one to a logical zero.

The adaptive keeper circuit 110 also includes a keeper stage 225 which may include a feedback loop for holding or keeping the logical state of logical state node 207. For example, during an evaluation phase, the pull down circuit 230 uses one or more input signals (such as enable signal 232 and dynamic input 234) to determine whether to change the logical state at logical state node 207. If the input signals indicate that the logical state of logical state node 207 should not change, then the keeper stage 225 (along with the rest of the modules in the adaptive keeper circuit 110) holds logical state node 207 at its current logical state. However, if the input signals instruct the pull down circuit 230 to discharge the voltage at logical state node 207 (i.e., change the logical state), the circuit 230 may do so without interference from the adaptive keeper circuit 110. Once the pull down circuit 230 discharges the voltage at logical state node 207, the adaptive keeper circuit 110 then holds that logical state until the next pre-charge phase, when the logical state of logical state node 207 is reset.

Figure 3:
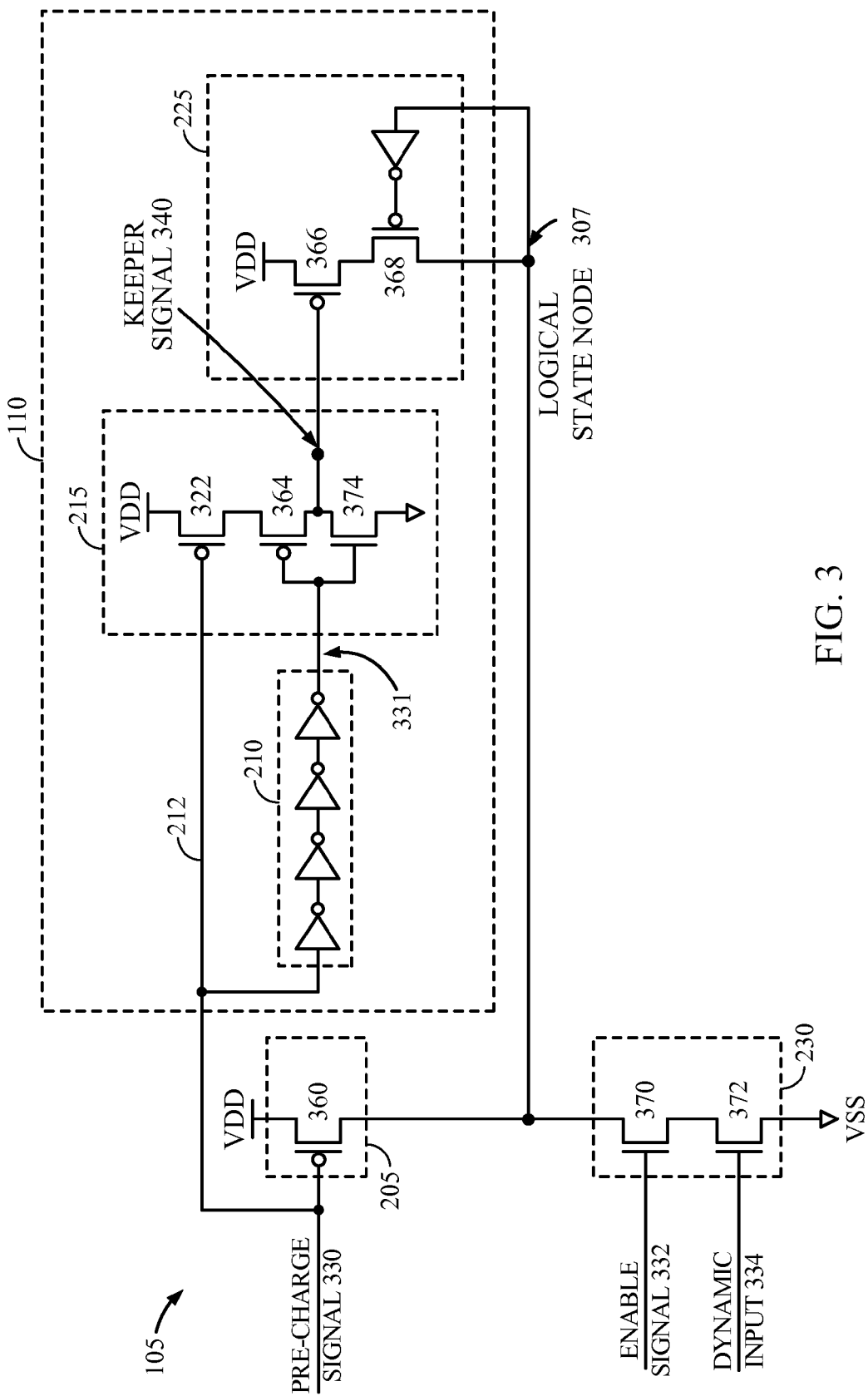
FIG. 3 is a schematic of a dynamic circuit with an adaptive keeper circuit, according to one aspect.

FIG. 3 is a schematic of the dynamic circuit 105 with the adaptive keeper circuit 110, according to one aspect. In addition to keeper circuit 225, the dynamic circuit 105 includes the pre-charge circuit 205 and the pull down circuit 230. The pre-charge circuit 205 includes PMOS 360 that conditionally couples a logical state node 307 to VDD in order to reset the logical state of logical state node 307 to a logical one (i.e., VDD). Specifically, when a pre-charge signal 330 is low during the pre-charge phase, PMOS 360 is on and logical state node 307 is driven to VDD. However, during the evaluation phase when the pre-charge signal 330 is high, PMOS 360 is turned off and logical state node 307 is decoupled from VDD with respect to the pre-charge circuit 205.

The pull down circuit 230 includes two NMOS transistors coupled in series. An enable signal 332 controls the gate of NMOS 370 while a dynamic input 334 controls the gate of NMOS 372. In one example, the dynamic input 334 may be an output from a memory bit cell or any other dynamic input. When both the enable signal 332 and dynamic input 334 are high during the evaluation phase, then NMOS 370 and NMOS 372 are turned on and couple logical state node 307 to VSS, and the voltage of logical state node 307 is pulled down to VSS (i.e., logical zero).

The keeper circuit 110 includes a plurality of series connected inverters to delay the pre-charge signal 330. Because the pre-charge signal 330 flows through the inventors 210, the node corresponding to a control signal 331 (i.e., a control signal for the keeper circuit 110) is a delayed, inverted version of the pre-charge signal 330. The control signal 331 is then used to operate the pre-stage circuit 215. Specifically, the control signal 331 is coupled to the gates of PMOS 364 and NMOS 374. For example, when the pre-charge signal 330 transitions from high to low, after some delay, the control signal 331 also transitions from high to low thereby turning on PMOS 364 but turning off NMOS 374.

Moreover, the pre-stage circuit 215 receives an undelayed version of a pre-charge signal 330 along the feed-forward path 212. The pre-charge signal 330 controls the gate of PMOS 322 (which, in one embodiment, has the same function as PMOS 222 shown in FIG. 2) while control signal 331 controls the gate of PMOS 364 and NMOS 374. Thus, the keeper signal 340 (i.e. a control signal for the adaptive keeper circuit 110) is high (i.e., at VDD) when both PMOS 322 and PMOS 364 are on (ignoring any leakage current). NMOS 374 drives the keeper signal 340 low when the control signal 331 is high. In one aspect, the ratio of width to length of NMOS 374 is larger than the ratio of width to length of PMOS 322 and PMOS 364. Further still, in one aspect, the dimensions of NMOS 374 are selected so that the ratio between the dimensions of NMOS 374 and PMOS 322/PMOS 364 is the same as or substantially similar to the ratio between the dimensions of NMOS 372 and PMOS 366/PMOS 368. Moreover, although FIG. 3 illustrates only one pull down circuit 230, in other examples, the dynamic circuit 105 may include multiple parallel pull down circuits coupled to logical state node 307.

The keeper signal 340 controls the gate voltage of PMOS 366. When the keeper signal 340 is low, PMOS 366 couples the drain of PMOS 368 to VDD. When the keeper signal is high, the drain of PMOS 368 is floating. The gate of PMOS 368 is controlled by a feedback loop that includes the logical state node 307 and an inverter which allows the keeper stage 225 to hold the logical state node 307 at its current value. When the voltages at the gates of PMOS 366 and PMOS 368 are both low, then the logical state node 307 is driven to VDD. However, if either of these transistors is off, the logical state node 307 is disconnected from VDD with respect to the keeper stage 225.

Figure 4A:
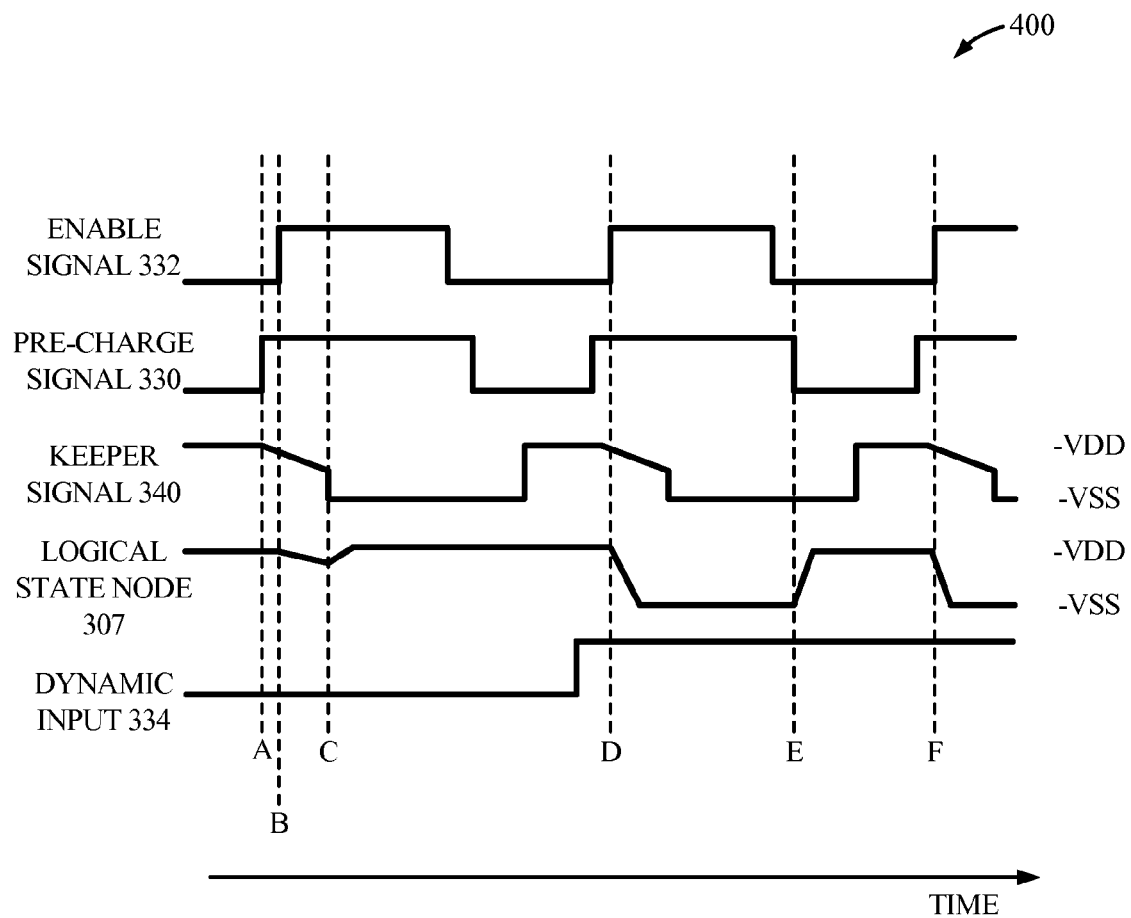
FIGS. 4A and 4B are timing charts corresponding to the signals in FIG. 5, according to one aspect.
Figure 4B:
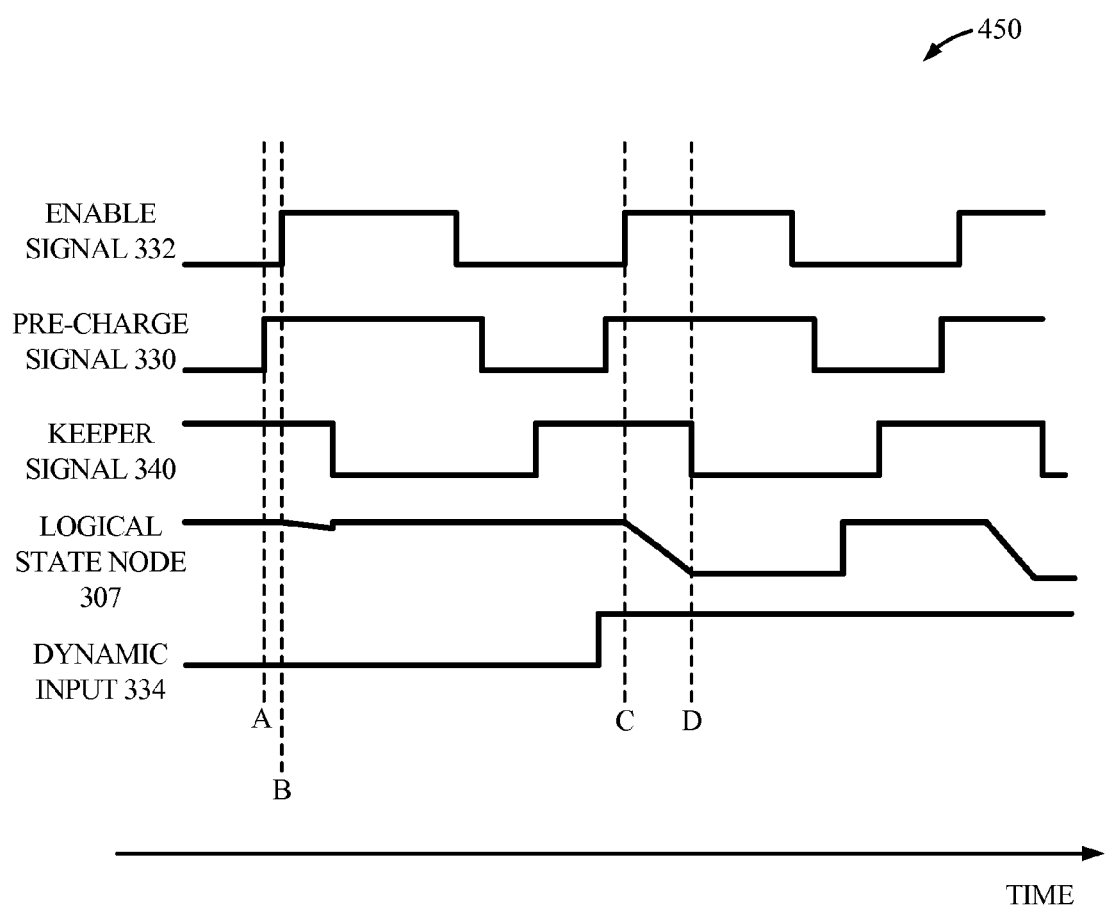

FIGS. 4A and 4B are timing charts corresponding to the signals in FIG. 3, according to one aspect. Specifically, FIG. 4A includes timing chart 400 where the NMOS transistors in the dynamic circuit 105 are strong and the PMOS transistors are weak, while FIG. 4B includes timing chart 450 where the NMOS transistors in the dynamic circuit 105 are weak and the PMOS transistors are strong.

In the example illustrated by chart 400, the variations of the PMOS and NMOS transistors due to the fabrication process may result in the NMOS transistors being leakier than the PMOS transistors. At Time A, the pre-charge signal 330 transitions to a high state which turns off PMOS 360 in pre-charge circuit 205. In parallel, because of the feed-forward path 212, the undelayed version of the pre-charge signal 330 turns off PMOS 322 in the pre-stage circuit 215, thereby disconnecting the keeper signal 340 from VDD. Moreover, the output of the delay circuit 210 (i.e., control signal 331) is still low which means NMOS 374 is turned off, and thus, the keeper signal 340 is also disconnected from VSS. Because the keeper signal 340 is disconnected from both VDD and VSS, it is electrically floating at Time A—i.e., has no direct electrical connection to any voltage rail. However, because NMOS 374 is stronger than PMOS 322 and has a greater leakage current, the leakage current flowing through NMOS 374 begins to deplete the voltage of the keeper signal 340, thereby pulling the keeper signal 340 down towards VSS. The keeper signal 340 remains coupled to VDD at Time A, and thus does not discharge.

At Time B, the enable signal 332 is high but the dynamic input 334 is low, and thus, logical state node 307 is disconnected from VSS since NMOS 372 remains off. Moreover, both the keeper signal 340 and pre-charge signal 330 are high (despite the voltage of the keeper signal 340 being somewhat depleted) which means PMOS 360 and PMOS 366 are off, thereby disconnecting logical state node 307 from VDD. Thus, logical state node 307 is electrically floating. Nonetheless, because of the leakage current flowing through NMOS 372, which is assumed to be greater than the leakage current flowing through PMOS 360 and PMOS 366, the voltage at logical state node 307 begins to droop between Time B and Time C. However, the adaptive keeper circuit 110 begins to activate (or turn on) PMOS 366 to counteract the leakage current flowing through NMOS 372. As seen in chart 400, assuming NMOS 372 in the pull down circuit 230 has the same dimensions as NMOS 374 in the adaptive keeper circuit 110, the leakage currents flowing through NMOS 372 and NMOS 374 are substantially the same. Thus, the voltages of the keeper signal 340 and the logical state node 307 change at a similar rate. As the keeper signal 340 begins to droop, the gate voltage of PMOS 366 decreases which increases the amount of current flowing through this transistor. Although this droop may not fully activate (i.e., turn on) PMOS 366, the change in gate voltage nonetheless begins to turn on PMOS 366 and increases the current flowing therethrough and thus increases an output current of the adaptive keeper circuit 110. By electrically floating the keeper signal 340, leakage current through NMOS 374 causes the keeper signal 340 to droop and begin to turn on PMOS 366. The droop in the keeper signal 340 thus adjusts an activation delay associated with the adaptive keeper circuit 110 such that PMOS 366 begins to turn on thereby counteracting the voltage droop on logical state node 307 caused by the pull down circuit 230.

In one example, the rate at which the voltage of the keeper signal 340 decreases between Time A and Time C is substantially the same as the rate at which the voltage of logical state node 307 decreases between Time B and Time C. This similar change in the rates may be achieved if the dimensions of the PMOS and NMOS transistors controlling the voltage of the keeper signal 340 have the same or substantially similar dimensions as the PMOS and NMOS transistors controlling the voltage of logical state node 307. However, it is not necessary for these two rates to be the exactly the same in order for the keeper signal 340 to mitigate the droop in voltage of the logical state node 307 and reduce the likelihood that the correct logical state of logical state node 307 is lost.

By using the feed-forward path 212 to turn on PMOS 366 sooner (i.e., reducing the delay before the adaptive keeper circuit 110 begins to activate), the droop in the voltage at logical state node 307 is mitigated or prevented. The increased current provided by PMOS 366 reduces the rate at which the voltage of logical state node 307 falls due to leakage current through NMOS 372. Stated more generally, regardless of the difference of the strength and/or leakage currents between the PMOS and NMOS transistors in the dynamic circuit 105, the adaptive keeper circuit 110 is able to adapt to this difference and prevent losing the logical state of an associated logical state node, such as logical state node 207 or logical state node 307. Specifically, even if the NMOS transistors have leakage currents that would otherwise cause the logical state to fall to VSS between Time B and Time C, the adaptive keeper circuit 110 uses NMOS 374 to cause the keeper signal 340 to droop and begin to turn on PMOS 366 sooner. Doing so increases the current flowing through PMOS 366 and increases the output current of the adaptive keeper circuit 110, which counteracts the leakage current flowing through NMOS 372. Because the adaptive keeper circuit 110 uses the same type of circuit element that affects logical state node 307 (e.g., NMOS 372) to affect the keeper signal 340 (e.g., NMOS 374), the case where the NMOS transistors are stronger than the PMOS transistors can be handled without causing abnormal behavior.

If, however, the PMOS transistors and the NMOS transistors in the dynamic circuit 105 were the same strength rather than being different (i.e., both weak or both strong), then the leakage currents through PMOS 322, PMOS 364, and NMOS 374 would counteract each other and the keeper signal 340 would droop less (or not droop at all). However, this is acceptable since the voltage of logical state node 307 would also not droop since any leakage current through NMOS 372 would be similarly counteracted by the leakage currents through PMOS 360 and PMOS 366, and thus, there is no risk of the logical state node 307 erroneously changing its logical state.

At Time C, the control signal 331 (i.e., the delayed version of the pre-charge signal 330) transitions from low to high thereby activating NMOS 374 and coupling the keeper signal 340 to VSS. Driving the keeper signal 340 to VSS fully activates (i.e., turns on) PMOS 366 thereby connecting logical state node 307 to VDD. Moreover, the keeper signal 340 is no longer electrically floating but is directly connected to VSS via NMOS 374. In response, the droop caused by the leakage current flowing through NMOS 372 is remedied by PMOS 366 driving logical state node 307 back to VDD. However, as described above, by at least partially activating PMOS 366 sooner, the voltage droop at logical state node 307 is mitigated and an erroneous change of logical state is prevented.

At Time D, both the enable signal 332 and the dynamic input 334 are high, and thus, the pull down circuit 230 connects logical state node 307 to VSS and begins to discharge logical state node 307. Because the keeper signal 340 is again floating, it droops in the same manner as shown in Time A which begins to activate PMOS 366. However, because the NMOS 370 and NMOS 372 are strong, the voltage on logical state node 307 is quickly discharged which turns off PMOS 368 and prevents any increased current from PMOS 366 from affecting the voltage of logical state node 307. That is, even though the adaptive keeper circuit 110 begins to activate PMOS 366, doing so does not adversely affect evaluation of logical state node 307 since the feedback loop through the inverter quickly turns off PMOS 366.

At Time E, the pre-charge signal 330 is low which turns on PMOS 360 and connects logical state node 307 to VDD and drives logical state node 307 into the reset state (i.e., logical one). PMOS 366 in the adaptive keeper circuit 110 is also on which provides an additional connection to VDD to drive up the voltage of logical state node 307 once PMOS 368 turns on. Moreover, the enable signal 332 is low, and thus, NMOS 370 is off, which disconnects logical state node 307 from VSS and prevents a drive fight. The same process at Time D then repeats during the evaluation phase shown at Time F.

Timing chart 400 illustrates one advantage of matching the behavior of the adaptive keeper circuit 110 with the pull down circuit 230. Conventionally, matching the behavior of these two circuits is difficult because the characteristics of PMOS transistors (which are used in the keeper circuit) are not correlated to the characteristics of NMOS transistors (which are used in the pull down circuit) across variations in the fabrication process. However, the adaptive keeper circuit 110 includes the feed-forward path 212 which bypasses the delay circuit 210 and permits the keeper signal 340 to float between Time A and Time C, which allows NMOS 374 in the adaptive keeper circuit 110 (which has characteristics that are similar to NMOS 372 in the pull down circuit 230) to affect the keeper signal 340 in a similar manner as NMOS 372 affects logical state node 307.

Unlike in FIG. 4A, FIG. 4B illustrates a timing chart 450 where the NMOS transistors in the dynamic circuit 105 are weak but the PMOS transistors are strong. As described above, when the NMOS transistors are strong, the adaptive keeper circuit 110 begins to activate PMOS 366 earlier which helps to counteract the leakage current caused by the NMOS 372. In contrast, when PMOS transistors are strong and the NMOS transistors are weak, the adaptive keeper circuit 110 delays activating PMOS 366 to provide the pull down circuit 230 more time to discharge logical state node 307.

At Time A, the pre-charge signal 330 transitions to a high state, which turns off PMOS 360 in pre-charge circuit 205. In parallel, because of the feed-forward path 212, the undelayed version of the pre-charge signal 330 turns off PMOS 322 in the pre-stage circuit 215, thereby disconnecting the keeper signal 340 from VDD. Moreover, the control signal 331, which is the output of the delay circuit 210, is low which means NMOS 374 is turned off, and thus, the keeper signal 340 is floating. Because in this example the NMOS transistors are weak and leak less and the PMOS transistors are strong and leak more, PMOS 322 and PMOS 364 are stronger relative to NMOS 374 and the voltage of the keeper signal 340 will droop less than the droop shown in FIG. 4A (or not droop at all). Stated differently, any leakage current from NMOS 374 is countered by the leakage current through PMOS 322 and PMOS 364 which either reduces the droop in the keeper signal 340 or prevents it.

At Time B, the enable signal 332 goes high which turns on NMOS 370 but the dynamic input 334 is low keeping NMOS 372 off. In contrast to chart 400, here the droop of the logical state node 307 will either be less than the droop of logical state node 307 illustrated in chart 400 or prevented altogether. That is, any leakage current through NMOS 372 (which is weak) is countered by leakage current through PMOS 360 or PMOS 366 (which are strong). Thus, when the NMOS transistors are weak but the PMOS transistors are strong, the voltage of logical state node 307 drooping such that the correct logical state is lost is not of concern.

However, in this example the circuit designer is faced with another challenge where the weak NMOS transistors in the pull down circuit 230 take longer to discharge logical state node 307 than when the NMOS transistors are strong. At Time C, the enable signal 332 and dynamic input 334 are both high and the pull down circuit 230 begins to discharge logical state node 307. However, the rate of discharge is slower than the rate of discharge shown in chart 400. Unlike in chart 400 where the adaptive keeper circuit 110 begins to activate the PMOS 366 sooner by permitting the keeper signal 340 to droop, here the adaptive keeper circuit 110 delays activating PMOS 366 in order to provide the pull down circuit 230 with as much time as possible (i.e., before the low to high transition of the control signal 331 changes the keeper signal 340 from high to low) to discharge logical state node 307. The droop caused by leakage through NMOS 374 is countered by the leakage current flowing through PMOS 322 and PMOS 364 to hold the keeper signal 340 close to VDD—e.g., the keeper signal 340 is prevented from drooping. In so doing, the gate voltage of PMOS 366 is maintained close to VDD which reduces the amount of leakage current that flows through PMOS 366 and PMOS 368 into logical state node 307 which would otherwise hamper NMOS 370 and NMOS 372 from driving logical state node 307 to VSS.

At Time D, the control signal 331 transitions from low to high causing the keeper signal 340 to transition from VDD to VSS, thereby turning on PMOS 366. However, by this time, the pull down circuit 230 has already discharged logical state node 307 which turns off PMOS 368 and prevents logical state node 307 from being connected to VDD through the adaptive keeper circuit 110. Thus, in this manner, the adaptive keeper circuit 110 adapts to situations where the NMOS transistors are weak and the PMOS transistors are strong by waiting until the low to high transition in the control signal 331 reaches the pre-stage circuit 215 before activating PMOS 366. Thus, the circuit designer can design the delay of the delay circuit 210 such that the weakest possible NMOS transistors for a given process corner still have enough time to discharge logical state node 307 before the keeper signal 340 transitions from VDD to VSS. Thus, using the same design, the adaptive keeper circuit 110 can begin to turn on PMOS 366 sooner when the when NMOS transistors are strong and the PMOS transistors are weak and turn on PMOS 366 later when the NMOS transistors are weak and the PMOS transistors are strong.

Figure 5:
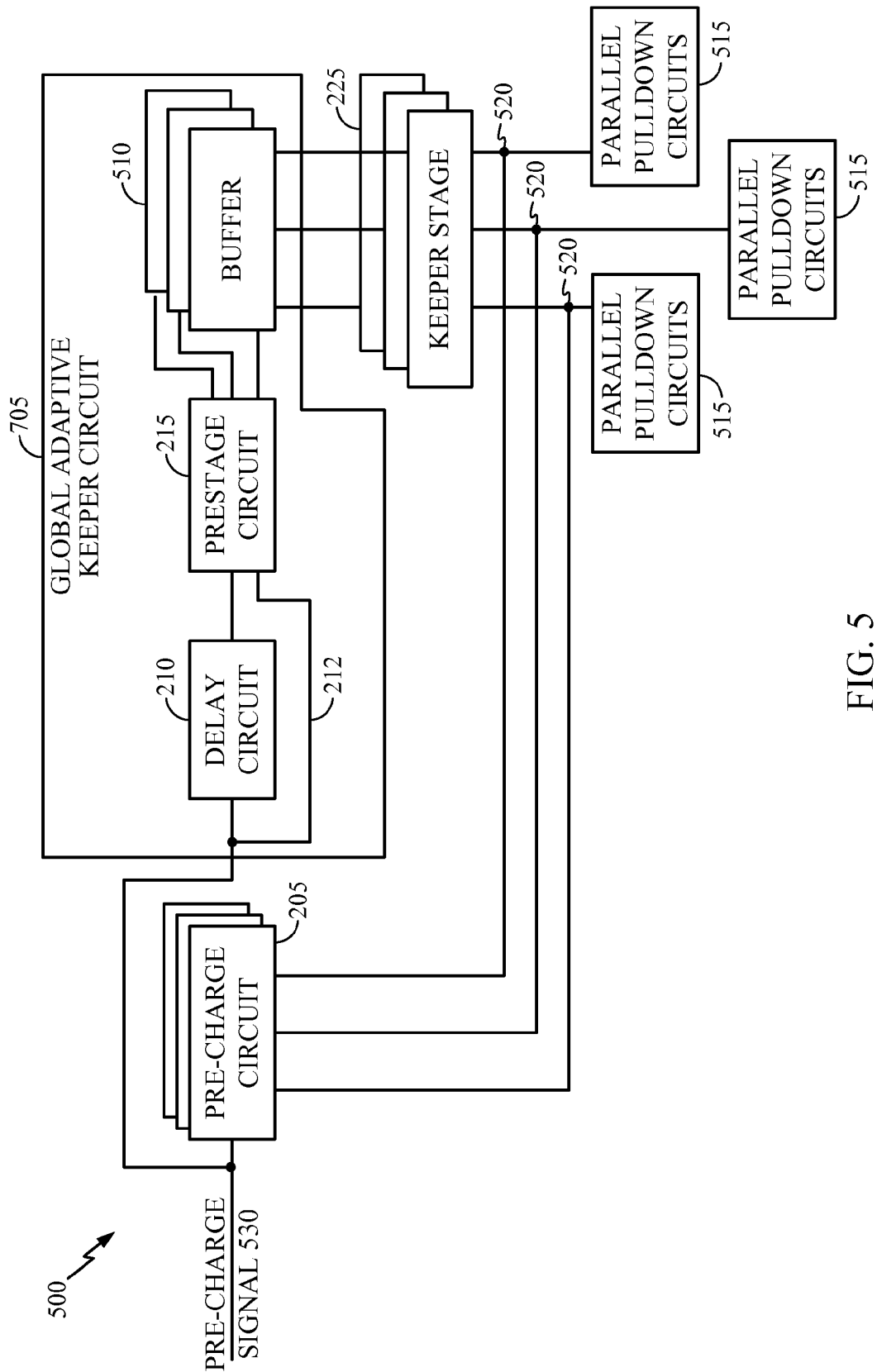
FIG. 5 is a functional block diagram of a dynamic circuit with a global adaptive keeper circuit, according to one aspect.

FIG. 5 is a functional block diagram of a dynamic circuit 500 with a global adaptive keeper circuit 505, according to one aspect. In contrast to FIG. 2 which illustrates an adaptive keeper circuit 110 that may be used with one or more parallel pull down circuits, the global adaptive keeper circuit 505 can be used with multiple parallel pull down circuits 515. That is, while the adaptive keeper circuit 110 in FIG. 2 may have multiple pull down circuits 230 coupled to the same logical state node, the global adaptive keeper circuit 505 has multiple logical state nodes 520 that are each coupled to one or more parallel pull down circuits 515.

The dynamic circuit 500 includes a respective pre-charge circuit 205 for each of the various logical state nodes 520. Alternatively, instead of multiple pre-charge circuits 205, the dynamic circuit 500 may include one pre-charge circuit 205 that uses a plurality of buffers to drive the logical state nodes 520. Like in FIG. 2, a pre-charge signal 730 is fed into the delay circuit 210 and the feed-forward path 212. The delayed and undelayed version of the pre-charge signal 730 are used by the pre-stage circuit 215 in order to control the a global control signal (not shown) and adapt to the differences in characteristics between the NMOS and PMOS transistors as described above. However, unlike the keeper circuit shown in FIG. 2, the global adaptive keeper circuit 505 includes a plurality of buffers 510 that drive the global control signal (i.e. a global keeper signal) to respective keeper stages 225 as a plurality of local control signals (i.e. as a plurality of local keeper signals). The keeper stages 225 (i.e., "local" keeper circuits) are then coupled to a respective one of the logical state nodes 520 to perform the functions described above at each of the logical state nodes 520. Thus, the global adaptive keeper circuit 505 needs only one instance of the delay circuit 210, feed-forward path 212, and pre-stage circuit 215 to drive multiple logical state nodes 520 across the dynamic circuit 500.

The logical state nodes 520 are coupled to respective parallel pull down circuits 515. These parallel pull down circuits 515 may include one pull down circuit (e.g., the pull down circuit 230 shown in FIG. 3) or multiple parallel pull down circuits. As such, dynamic circuit 500 provides multiple logical state nodes 520 that can be connected to independent groups of parallel pull down circuits 515. The global adaptive keeper circuit 505 may thus reduce the size and complexity of the dynamic circuit 500 by sharing the delay circuit 210, feed-forward path 212, and pre-stage circuit 215 among the different parallel pull down circuits 515.

Figure 6:
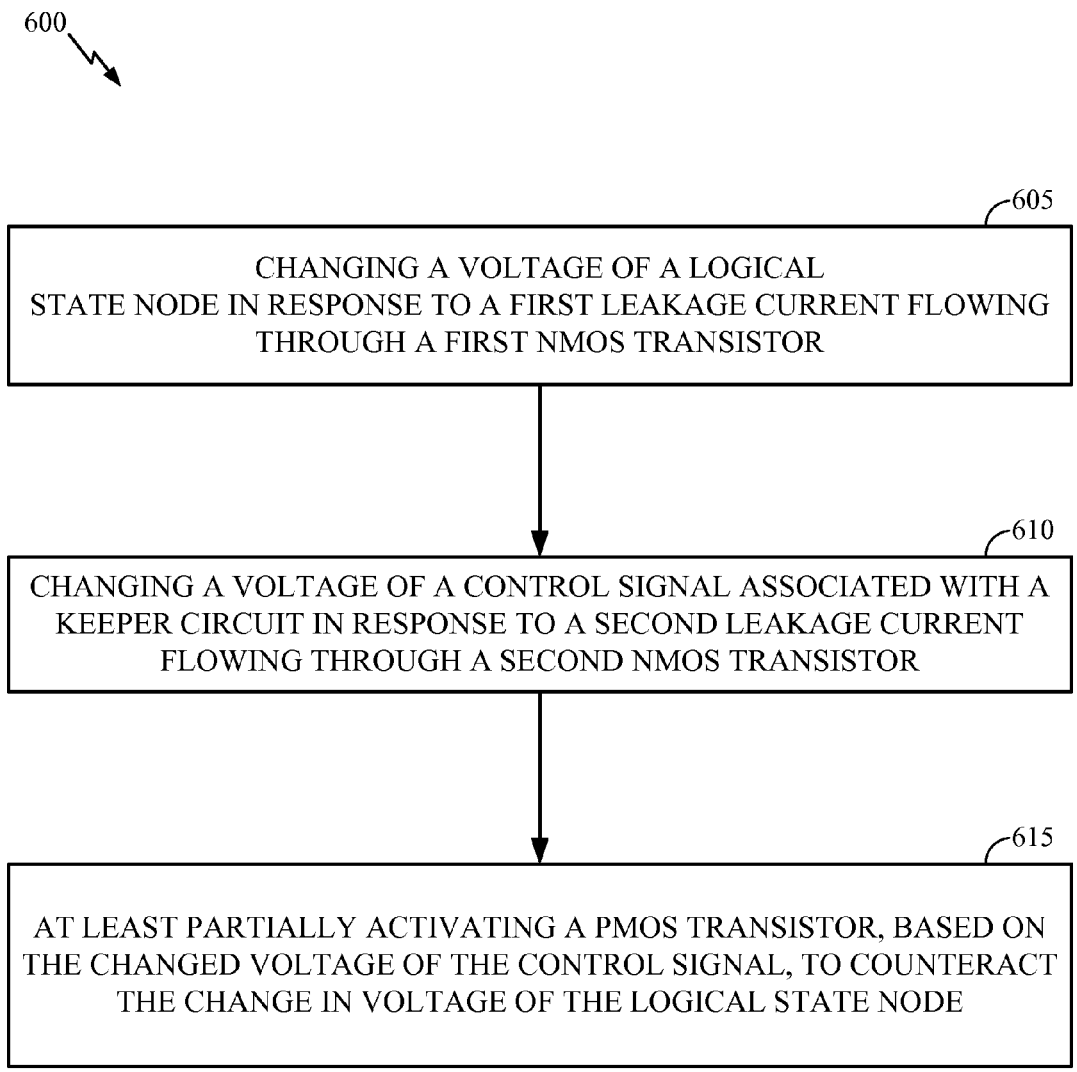
FIG. 6 is a method for controlling an adaptive keeper circuit to prevent a loss of state during an evaluation phase, according to one aspect.

FIG. 6 illustrates a method 600 for controlling an adaptive keeper circuit to prevent a loss of logical state during an evaluation phase, according to one aspect. The method 800 may correspond to the operation of the circuits of FIGS. 1, 2, 3 and 5, in some aspects, and circuit elements described with respect to the method 800 may correspond to circuit elements described in reference to FIGS. 1, 2, 3 and 5. The method comprises, at block 605, changing a voltage of a logical state node in response to a first leakage current flowing through a first NMOS transistor. The first NMOS transistor may be in a pull down circuit. Because the logical state node is electrically floating for at least a portion of this time period, the first leakage current could potentially erroneously reduce the voltage of the logical state node until a loss of logical state occurs.

The method further comprises, at block 610, changing the voltage of a control signal associated with a keeper circuit in response to a second leakage current flowing through a second NMOS transistor. The second NMOS transistor may be in the keeper circuit and may be coupled to the control signal, which may be a keeper signal. In one example, the control signal is electrically floating (i.e., not connected to any voltage rail) thereby permitting the second leakage current flowing through the second NMOS transistor to change the voltage of the control signal. Because the first and second NMOS transistors may have similar characteristics (e.g., cause the same amount leakage current), regardless of variations in the fabrication process, the second NMOS transistor in the keeper circuit changes the voltage of the floating control signal at a similar rate at which the first NMOS transistor in the pull down circuit changes the voltage of the floating logical state node.

The method further comprises, at block 615, at least partially activating a PMOS transistor, based on the changed voltage of the control signal, to counteract the change in voltage of the logical state node. In one aspect, a decrease in voltage of the control signal caused by the leakage current through the second NMOS transistor may not fully activate the PMOS transistor, but the decrease in voltage nonetheless increases the current flowing through the PMOS transistor, and thus, increases an output current of the keeper circuit. This increase in the output current of the keeper circuit counteracts (i.e., mitigates) the change in voltage caused by the leakage current of the first NMOS transistor in the pull down circuit. In this manner, even though the first NMOS transistor is strong, the rate at which the first NMOS transistor in the pull down circuit changes the voltage of the logical state node during an evaluation phase where a dynamic input is low is reduced or mitigated by the increased output current provided by the keeper circuit.

A number of aspects have been described. However, various modifications to these aspects are possible, and the principles presented herein may be applied to other aspects as well.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A dynamic circuit, comprising:
   a logical state node;
   a keeper circuit coupled to the logical state node, the keeper circuit comprising a first circuit element configured to output a control signal that affects an activation delay associated with the keeper circuit; and
   a pull down circuit coupled to the logical state node, the pull down circuit comprising a second circuit element;
   wherein the first circuit element is configured to electrically float the control signal in parallel with the second circuit element changing a voltage on the logical state node during at least a portion of an evaluation phase of the dynamic circuit.

2. The dynamic circuit of claim 1, wherein the keeper circuit comprises a transistor coupled to the logical state node, wherein a gate of the transistor is activated by the control signal, and
   wherein, during the evaluation phase, a voltage change of the control signal caused by the first circuit element increases a current flowing through the transistor.

3. The dynamic circuit of claim 2, wherein the current flowing through the transistor counteracts the change in voltage on the logical state node caused by the second circuit element, and wherein the first and second circuit elements are NMOS transistors.

4. The dynamic circuit of claim 1, further comprising:
   a pre-charge circuit configured to, based on a pre-charge signal, reset a state of the logical state node during a pre-charge phase;
   a delay circuit in the keeper circuit configured to receive the pre-charge signal and output a delayed version of the pre-charge signal;
   a feed-forward path in the keeper circuit configured to receive the pre-charge signal and output an undelayed version of the pre-charge signal; and
   a pre-stage circuit comprising the first circuit element, the pre-stage circuit being coupled to the output of the delay circuit and the output of the feed-forward path, the pre-stage circuit outputting the control signal.

5. The dynamic circuit of claim 4, wherein the pre-stage circuit is configured to electrically float the control signal during at least a portion of the evaluation phase based on the output of the feed-forward path, wherein the electrically floated control signal affects the activation delay associated with the keeper circuit.

6. The dynamic circuit of claim 4, wherein the first circuit element is a first NMOS transistor and the second circuit element is a second NMOS transistor;
   wherein the pre-stage circuit further comprises a first PMOS transistor and a second PMOS transistor; and
   wherein the keeper circuit further comprises a third PMOS transistor and a fourth PMOS transistor.

7. The dynamic circuit of claim 6, wherein a ratio between a dimension of the first NMOS transistor and a dimension of the first PMOS transistor and second PMOS transistor is substantially the same as a ratio between a dimension of the second NMOS transistor and a dimension of the third PMOS transistor and fourth PMOS transistor.

8. The dynamic circuit of claim 6, wherein a ratio of width to length of the first NMOS transistor is larger than a ratio of width to length of the first PMOS transistor and second PMOS transistor.

9. The dynamic circuit of claim 1, wherein, when the control signal is electrically floating, a change in voltage of the control signal is caused by a leakage current flowing through the first circuit element.

10. The dynamic circuit of claim 1, wherein the first and second circuit elements are a same circuit element type.

11. A dynamic circuit, comprising:
means for selectively keeping a voltage of a logical state node of the dynamic circuit;
means for selectively pulling down the voltage of the logical state node during an evaluation phase; and
means for preventing a loss of a logical state of the logical state node by electrically floating a control signal that affects an activation delay associated with the means for selectively keeping in parallel with the means for selectively pulling down the voltage of the logical state node during at least a portion of the evaluation phase.

12. The dynamic circuit of claim 11, further comprising means for generating a current during the evaluation phase to mitigate a change in the voltage of the logical state node caused by the means for selectively pulling down, wherein the means for generating a current is activated by the control signal.

13. The dynamic circuit of claim 11, further comprising:
means for resetting a state of the logical state node based on a pre-charge signal during a pre-charge phase;
means for receiving the pre-charge signal and outputting a delayed version of the pre-charge signal;
means for receiving the pre-charge signal and outputting an undelayed version of the pre-charge signal; and
means for receiving the delayed version of the pre-charge signal and the undelayed version of the pre-charge signal and, based on the delayed version of the pre-charge signal and the undelayed version of the pre-charge signal, either outputting the control signal or electrically floating the control signal during at least a portion of the evaluation phase.

14. A method of operating a dynamic circuit, comprising:
changing a voltage of a logical state node in response to a first leakage current flowing through a first NMOS transistor;
changing a voltage of a control signal associated with a keeper circuit in response to a second leakage current flowing through a second NMOS transistor in the keeper circuit; and
at least partially activating a PMOS transistor, based on the changed voltage of the control signal, to counteract the change in voltage of the logical state node.

15. The method of claim 14, wherein partially activating the PMOS transistor increases an output current of the keeper circuit, and wherein the increased output current prevents the dynamic circuit from losing a logical state, and wherein a gate of the PMOS transistor is coupled to the control signal.

16. The method of claim 14, wherein the control signal affects an activation delay associated with the keeper circuit.

17. The method of claim 14, wherein, the second leakage current flowing through the second NMOS transistor changes the voltage of the control signal while the control signal is electrically floating.

18. The method of claim 14, further comprising:
transmitting a pre-charge signal to a delay circuit in the keeper circuit, the delay circuit outputting a delayed pre-charge signal;
transmitting the pre-charge signal along a feed-forward path in the keeper circuit that bypasses the delay circuit, the feed-forward path outputting an undelayed pre-charge signal; and
adjusting the control signal based on both the delayed pre-charge signal and the undelayed pre-charge signal.

19. The method of claim 18, further comprising:
electrically floating the control signal during at least a portion of an evaluation phase based on the undelayed pre-charge signal received on the feed-forward path.

20. A dynamic circuit, comprising:
a delay circuit in a global adaptive keeper circuit configured to receive a pre-charge signal and output a delayed version of the pre-charge signal;
a feed-forward path in the global adaptive keeper circuit configured to receive the pre-charge signal and output an undelayed version of the pre-charge signal;
a pre-stage circuit comprising a first circuit element, the pre-stage circuit being coupled to the output of the delay circuit and the output of the feed-forward path, the pre-stage circuit configured to output a global control signal;
a plurality of logical state nodes;
a plurality of local keeper circuits, each associated with one of the plurality of logical state nodes, each of the plurality of local keeper circuits configured to receive one of a plurality of local control signals, each of the plurality of local control signals configured to be generated based on the global control signal, each of the plurality of local control signals is configured to affect an activation delay associated with one of the plurality of local keeper circuits; and
a plurality of pull down circuits, each associated with one of the plurality of logical state nodes and one of the plurality of local keeper circuits, each of the plurality of pull down circuits comprising a second circuit element;
wherein, during at least a portion of an evaluation phase of the dynamic circuit, the first circuit element is configured to electrically float each local control signal in parallel with each second circuit element changing a voltage on each associated logical state node of the plurality of logical state nodes.

21. The dynamic circuit of claim 20, further comprising a single pre-charge circuit coupled to each of the plurality of logical state nodes via a plurality of buffers.

22. The dynamic circuit of claim 20, further comprising a plurality of pre-charge circuits, each of the plurality of pre-charge circuits coupled to one of the plurality of logical state nodes.

23. The dynamic circuit of claim 20, wherein each of the plurality of local control signals is generated by one of a plurality of buffers, each of the plurality of buffers responsive to the global control signal.

24. A design structure embodied in a non-transitory computer readable medium for at least one of designing, manufacturing, and testing a design, the design structure comprising:
- a logical state node;
- a keeper circuit coupled to the logical state node, the keeper circuit comprising a first circuit element configured to output a control signal that affects an activation delay associated with the keeper circuit; and
- a pull down circuit coupled to the logical state node, the pull down circuit comprising a second circuit element;
- wherein the first circuit element is configured to electrically float the control signal in parallel with the second circuit element changing a voltage on the logical state node during at least a portion of an evaluation phase of a dynamic circuit.

25. The design structure of claim 24, further comprises:
- a pre-charge circuit configured to, based on a pre-charge signal, reset a state of the logical state node during a pre-charge phase;
- a delay circuit in the keeper circuit configured to receive the pre-charge signal and output a delayed version of the pre-charge signal;
- a feed-forward path in the keeper circuit configured to receive the pre-charge signal and output an undelayed version of the pre-charge signal; and
- a pre-stage circuit comprising the first circuit element, the pre-stage circuit being coupled to the output of the delay circuit and the output of the feed-forward path, the pre-stage circuit outputting the control signal.

26. A design structure embodied in a non-transitory computer readable medium for at least one of designing, manufacturing, and testing a design, the design structure comprising:
- a delay circuit in a global adaptive keeper circuit configured to receive a pre-charge signal and output a delayed version of the pre-charge signal;
- a feed-forward path in the global adaptive keeper circuit configured to receive the pre-charge signal and output an undelayed version of the pre-charge signal;
- a pre-stage circuit comprising a first circuit element, the pre-stage circuit being coupled to the output of the delay circuit and the output of the feed-forward path, the pre-stage circuit configured to output a global control signal;
- a plurality of logical state nodes;
- a plurality of local keeper circuits, each associated with one of the plurality of logical state nodes, each of the plurality of local keeper circuits configured to receive one of a plurality of local control signals, each of the plurality of local control signals configured to be generated based on the global control signal, each of the plurality of local control signals configured to affect an activation delay associated with one of the plurality of local keeper circuits; and
- a plurality of pull down circuits, each associated with one of the plurality of logical state nodes and one of the plurality of local keeper circuits, each of the plurality of pull down circuits comprising a second circuit element;
- wherein, during at least a portion of an evaluation phase of a dynamic circuit, the first circuit element is configured to electrically float each local control signal in parallel with each second circuit element changing a voltage on each associated logical state node of the plurality of logical state nodes.

* * * * *